United States Patent
Fu et al.

(10) Patent No.: US 10,580,360 B2
(45) Date of Patent: *Mar. 3, 2020

(54) PIXEL CIRCUIT AND DRIVING METHOD THEREOF, DISPLAY DEVICE

(71) Applicant: BOE TECHNOLOGY GROUP CO., LTD., Beijing (CN)

(72) Inventors: Jie Fu, Beijing (CN); Xiaochuan Chen, Beijing (CN); Shengji Yang, Beijing (CN); Lei Wang, Beijing (CN); Yankai Gao, Beijing (CN); Dongni Liu, Beijing (CN); Han Yue, Beijing (CN); Li Xiao, Beijing (CN); Pengcheng Lu, Beijing (CN); Mingfu Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/744,986

(22) PCT Filed: Aug. 17, 2017

(86) PCT No.: PCT/CN2017/097756
§ 371 (c)(1),
(2) Date: Jan. 15, 2018

(87) PCT Pub. No.: WO2018/113324
PCT Pub. Date: Jun. 28, 2018

(65) Prior Publication Data
US 2019/0012965 A1    Jan. 10, 2019

(30) Foreign Application Priority Data
Dec. 21, 2016 (CN) .......................... 2016 1 1196080

(51) Int. Cl.
*G09G 3/3258* (2016.01)
*G09G 3/3233* (2016.01)
(Continued)

(52) U.S. Cl.
CPC ......... *G09G 3/3258* (2013.01); *G09G 3/3233* (2013.01); *H01L 27/3276* (2013.01);
(Continued)

(58) Field of Classification Search
CPC ............... G09G 3/3258; G09G 3/3233; H01L 27/3276; H01L 51/5206; H01L 51/5221
See application file for complete search history.

(56) References Cited

U.S. PATENT DOCUMENTS

2004/0066146 A1    4/2004    Park et al.
2007/0236440 A1    10/2007   Wacyk et al.
(Continued)

FOREIGN PATENT DOCUMENTS

CN    1477610 A       2/2004
CN    103810965 A     5/2014
(Continued)

OTHER PUBLICATIONS

International Search Report of PCT/CN2017/097756 in Chinese, dated Oct. 26, 2017 with English translation.
(Continued)

*Primary Examiner* — Vijay Shankar
*Assistant Examiner* — Cory A Almeida
(74) *Attorney, Agent, or Firm* — Collard & Roe, P.C.

(57) ABSTRACT

A pixel circuit and a driving method thereof, and a display device. The pixel circuit includes a driving circuit, a light emitting circuit, a fusing circuit and a fusing control circuit. The driving circuit is configured to convert a voltage signal input from a first voltage terminal into a driving current signal, and to output the driving current signal to the fusing (Continued)

circuit; the fusing circuit is configured to disconnect the light emitting circuit from the driving circuit; the fusing control circuit is configured to control the driving current signal to flow to the ground terminal under control of a signal input from the control line, to disconnect the light emitting circuit from the driving circuit; and the light emitting circuit is configured to emit light under control of the second voltage terminal in a case that the light emitting circuit is not disconnected from the driving circuit.

9 Claims, 10 Drawing Sheets

(51) Int. Cl.
  *H01L 27/32* (2006.01)
  *H01L 51/52* (2006.01)
  *G09G 3/3266* (2016.01)

(52) U.S. Cl.
  CPC ...... *H01L 51/5206* (2013.01); *H01L 51/5221* (2013.01); *G09G 3/3266* (2013.01); *G09G 2310/0264* (2013.01); *G09G 2330/04* (2013.01); *G09G 2330/08* (2013.01); *G09G 2330/10* (2013.01)

(56) References Cited

U.S. PATENT DOCUMENTS

| | | |
|---|---|---|
| 2008/0116501 A1 | 5/2008 | Lin et al. |
| 2015/0108437 A1 | 4/2015 | Cho et al. |
| 2015/0138171 A1 | 5/2015 | Kim et al. |
| 2015/0213756 A1* | 7/2015 | Wacyk ................ G09G 3/3225 345/690 |
| 2016/0268364 A1 | 9/2016 | Yin et al. |
| 2019/0012965 A1 | 1/2019 | Fu et al. |

FOREIGN PATENT DOCUMENTS

| | | |
|---|---|---|
| CN | 104576686 A | 4/2015 |
| CN | 104637450 A | 5/2015 |
| CN | 104659058 A | 5/2015 |
| CN | 106531079 A | 3/2017 |
| CN | 106782318 A | 5/2017 |
| CN | 206271396 U | 6/2017 |
| CN | 206282593 U | 6/2017 |
| JP | 2009003009 A | 1/2009 |
| JP | 2011-164219 A | 8/2011 |

OTHER PUBLICATIONS

Notice of Transmittal of the International Search Report of PCT/CN2017/097756 in Chinese, dated Oct. 26, 2017.
Written Opinion of the International Searching Authority of PCT/CN2017/097756 in Chinese, dated Oct. 26, 2017 with English translation.
Chinese Office Action in Chinese Application No. 201611196080.8, dated Dec. 18, 2017 with English translation.
International Search Report of PCT/CN2017/102951 in Chinese, dated Dec. 27, 2017, with English translation.
Notice of Transmittal of the International Search Report of PCT/CN2017/102951 in Chinese, dated Dec. 27, 2017.
International Preliminary Report on Patentability of PCT/CN2017/102951, dated Jun. 25, 2019 and Written Opinion of the International Searching Authority of PCT/CN2017/102951 in Chinese, dated Dec. 27, 2017 with English translation.
Non-Final Office Action in U.S. Appl. No. 15/769,277 dated Sep. 5, 2019.

* cited by examiner

Fig. 7 when the pixel circuit is tested, inputting the scan signal to the scan signal line SL, inputting the turn-off signal to the data signal line DL, and inputting the first signal to the control line CL, so that the connection between the light emitting circuit 20 and the driving circuit 10 is interrupted when the driving circuit 10 outputs the driving current signal —S10 when the pixel circuit operates normally, inputting the scan signal to the scan signal line SL, inputting the data signal to the data signal line DL, and inputting the second signal to the control line CL, so that the driving current signal output by the driving circuit 10 drives the light emitting circuit 20 to emit light —S20

Fig. 8

PIXEL CIRCUIT AND DRIVING METHOD
THEREOF, DISPLAY DEVICE

CROSS REFERENCE TO RELATED
APPLICATIONS

This application is the National Stage of PCT/CN2017/097756 filed on Aug. 17, 2017, which claims priority under 35 U.S.C. § 119 of Chinese Application No. 201611196080.8 filed on Dec. 21, 2016, the disclosure of which is incorporated by reference.

TECHNICAL FIELD

Embodiments of the present disclosure relate to a pixel circuit and a driving method thereof, and a display device.

BACKGROUND

An organic light emitting diode (OLED for short) has advantages of self-luminous, high contrast, wide color gamut, simple manufacture procedure, and easy formation of flexible structures and the like. Therefore, a display technology using the organic light emitting diode has become an important display technology.

For example, an active matrix organic light emitting diode (AMOLED for short) has advantages of no perspective restriction, low manufacturing cost, fast response, power saving and the like, and so the active matrix organic light emitting diode has great development potential.

However, a current OLED display panel has a very high probability of generating bright spots due to issues such as design and process stability, and in many areas of application, tolerance of the bright spots issue is almost zero.

SUMMARY

According to a first aspect, an embodiment of the present disclosure provides a pixel circuit, comprising: a driving circuit, a light emitting circuit, a fusing circuit and a fusing control circuit.

Specifically, the driving circuit is respectively connected to a scan signal line, a data signal line, a first voltage terminal and the fusing circuit, and is configured to convert a voltage signal input from the first voltage terminal into a driving current signal under control of the scan signal line and the data signal line, and to output the driving current signal to the fusing circuit.

The fusing circuit is further connected to the fusing control circuit and the light emitting circuit, and is configured to disconnect the light emitting circuit from the driving circuit under control of the fusing control circuit.

The fusing control circuit is further connected to a control line and a ground terminal. The fusing control circuit is configured to control the driving current signal output from the driving circuit to the fusing circuit to flow to the ground terminal under control of a signal input from the control line, so as to disconnect the light emitting circuit from the driving circuit.

The light emitting circuit is further connected to a second voltage terminal, and is configured to emit light driven by the driving current signal output by the driving circuit under control of the second voltage terminal, in a case that a connection between the light emitting circuit and the driving circuit is not interrupted.

For example, the driving circuit comprises a first transistor, a second transistor and a storage capacitor. A gate electrode of the first transistor is connected to the scan signal line, a first electrode of the first transistor is connected to the data signal line, and a second electrode of the first transistor is connected to a gate electrode of the second transistor. A first electrode of the second transistor is connected to the first voltage terminal, and a second electrode of the second transistor is connected to the fusing circuit. One terminal of the storage capacitor is connected to the gate electrode of the second transistor, and another terminal of the storage capacitor is connected to the second electrode of the second transistor, or another terminal of the storage capacitor is connected to the first electrode of the second transistor.

For example, the fusing circuit comprises a fusing element; one terminal of the fusing element is connected to the driving circuit, and another terminal of the fusing element is connected to the light emitting circuit and the fusing control circuit.

For example, the fusing control circuit comprises a third transistor; a gate electrode of the third transistor is connected to the control line, a first electrode of the third transistor is connected to the fusing circuit, and a second electrode of the third transistor is connected to the ground terminal.

For example, the light emitting circuit comprises a light emitting element; an anode of the light emitting element is connected to the fusing circuit, and a cathode of the light emitting element is connected to the second voltage terminal.

Based on the above description, for example, the pixel circuit further comprises a control-line signal input circuit. The control-line signal input circuit is respectively connected to the scan signal line, the data signal line, the control line and a third voltage terminal, and is configured to input a first signal to the control line in a case that a scan signal is input to the scan signal line, and a turn-off signal is input to the data signal line, so as to disconnect the light emitting circuit from the driving circuit when the driving circuit outputs the driving current signal.

Furthermore, for example, the control-line signal input circuit comprises a fourth transistor and a fifth transistor. A gate electrode of the fourth transistor is connected to the data signal line, a first electrode of the fourth transistor is connected to the control line, and a second electrode of the fourth transistor is connected to the third voltage terminal. A gate electrode and a first electrode of the fifth transistor are connected to the scan signal line, and the second electrode of the fifth transistor is connected to the first electrode of the fourth transistor. A width-to-length ratio of a channel of the fourth transistor is more than 10 times a width-to-length ratio of a channel of the fifth transistor.

According to a second aspect, an embodiment of the present disclosure provides a display device, comprising the pixel circuit described in the first aspect.

According to a third aspect, an embodiment of the present disclosure provides a driving method of a pixel circuit, used for driving the pixel circuit described in the first aspect. The method comprises: when the pixel circuit is tested, inputting a scan signal to the scan signal line, inputting a turn-off signal to the data signal line, and inputting a first signal to the control line, so that a connection between the light emitting circuit and the driving circuit is interrupted when the driving circuit outputs a driving current signal; when the pixel circuit operates normally, inputting the scan signal to the scan signal line, inputting a data signal to the data signal line, and inputting a second signal to the control line, so that the driving current signal output by the driving circuit drives the light emitting circuit to emit light.

For example, inputting the first signal or the second signal to the control line comprises: under control of the scan signal line, the data signal line and the third voltage terminal, inputting the first signal or the second signal to the control line through the control-line signal input circuit.

An embodiment of the present disclosure provides a pixel circuit and a driving method thereof, and a display device. By inputting the scan signal to the scan signal line, inputting the turn-off signal to the data signal line, and inputting the first signal to the control line, in a case that the pixel circuit has a problem of a persistently-illuminating defect, a driving current signal output from the driving circuit to the fusing circuit flows to the ground terminal, and connection between the light emitting circuit and the driving circuit is interrupted, so that the problem of the persistently-illuminating defect can be solved. Otherwise, because the driving circuit does not output the driving current signal, the light emitting circuit and the driving circuit are still connected through the fusing circuit, and the normal operation of the pixel circuit is not affected. In a case that the pixel circuit operates normally, the scan signal is input to the scan signal line, the data signal is input to the data signal line, and the second signal is input to the control line, so that it can be ensured that the driving current signal output by the driving circuit drives the light emitting circuit to emit light. Based on this, it can be seen that, in the embodiments of the present disclosure, the pixels are not damaged on the basis of solving the problem of the persistently-illuminating defect.

BRIEF DESCRIPTION OF THE DRAWINGS

In order to clearly illustrate the technical solutions in the embodiments of the disclosure or in the prior art, the drawings required for describing the embodiments or prior technologies will be briefly described in the following; it is obvious that the described drawings are only related to some embodiments of the present disclosure; and for those skilled in the art can obtain other drawing(s) based on these drawings, without any inventive work.

DETAILED DESCRIPTION

The technical solutions of the embodiments will be described in a clearly and fully understandable way in connection with the drawings related to the embodiments of the disclosure. Apparently, the described embodiments are just a part but not all of the embodiments of the disclosure. Based on the described embodiments here, those skilled in the art can obtain other embodiment(s), without any inventive work, which should be within the scope of the disclosure.

Figure 1:
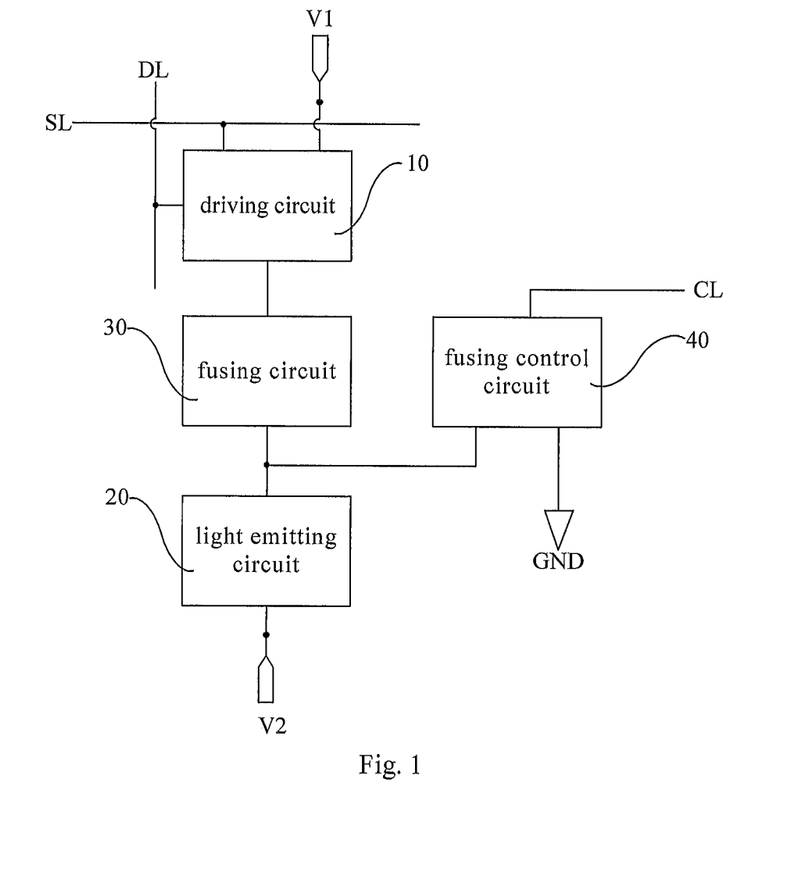
FIG. 1 is a first structural schematic diagram of a pixel circuit provided by an embodiment of the present disclosure.

An embodiment of the present disclosure provides a pixel circuit, as shown in FIG. 1, and the pixel circuit comprises a driving circuit 10, a light emitting circuit 20, a fusing circuit 30 and a fusing control circuit 40.

For example, the driving circuit 10 is respectively connected to a scan signal line SL, a data signal line DL, a first voltage terminal V1 and the fusing circuit 30. The driving circuit 10 is configured to convert a voltage signal input from the first voltage terminal V1 into a driving current signal under control of the scan signal line SL and the data signal line DL, and to output the driving current signal to the fusing circuit 30.

The fusing circuit 30 is further connected to the fusing control circuit 40 and the light emitting circuit 20, and is configured to disconnect the light emitting circuit 20 from the driving circuit 10 under control of the fusing control circuit 40.

The fusing control circuit 40 is further connected to a control line CL and a ground terminal GND. The fusing control circuit 40 is configured to control the driving current signal output from the driving circuit 10 to the fusing circuit 30 to flow to the ground terminal GND under control of a signal input from the control line CL, so as to disconnect the light emitting circuit 20 from the driving circuit 10.

The light emitting circuit 20 is further connected to a second voltage terminal V2, and is configured to emit light by the driving current signal output from the driving circuit 10 under control of the second voltage terminal V2.

A operation mode of the pixel circuit of an embodiment of the present disclosure comprises: in a case that the pixel circuit operates normally, inputting a second signal to the control line CL, so as to ensure that the light emitting circuit 20 and the driving circuit 10 are connected through the fusing circuit 30; and in this case, under the control of the second voltage terminal V2, the driving current signal output by the driving circuit 10 flows to the light emitting circuit 20 through the fusing circuit 30 to drive the light emitting circuit 20 to emit light. The generation of the second signal will be described below with reference to FIGS. 4-5.

In a case that a persistently-illuminating defect occurs in the pixel circuit, a first signal is input to the control line CL, so that the driving current signal output from the driving circuit 10 to the fusing circuit 30 flows to the ground terminal, so as to disconnect the light emitting circuit 20 from the driving circuit 10. In this case, because a current signal output by the driving circuit 10 can not flow to the light emitting circuit 20, the light emitting circuit 20 does not emit light. The generation of the first signal will be described below with reference to FIGS. 4-5.

It is to be noted that, firstly, for the fusing circuit 30, once the connection between the light emitting circuit 20 and the driving circuit 10 is interrupted under the control of the fusing control circuit 40, the light emitting circuit 20 and the driving circuit 10 can no longer restore to the connection state.

Secondly, the first terminal V1 may be connected to a power supply voltage terminal Vref or Vdd. The second voltage terminal V2 may be connected to a low voltage terminal or the ground terminal GND.

An embodiment of the present disclosure provides a pixel circuit. By inputting the scan signal to the scan signal line SL, inputting the turn-off signal to the data signal line DL, and inputting the first signal to the control line CL, in a case that the pixel circuit has the problem of the persistently-illuminating defect, the driving current signal output from the driving circuit 10 to the fusing circuit 30 flows to the ground terminal GND, and the connection between the light emitting circuit 20 and the driving circuit 10 is interrupted, so as to solve the problem of the persistently-illuminating defect. Certainly, in a case that the pixel circuit does not have the problem of the persistently-illuminating defect, because the driving circuit 10 does not output the driving current signal, the light emitting circuit 20 and the driving circuit 10 are still connected through the fusing circuit 30, and the normal operation of the pixel circuit is not affected. When the pixel circuit operates normally, the scan signal is input to the scan signal line SL, the data signal is input to the data signal line DL, and the second signal is input to the control line CL, so as to ensure that the driving current signal output by the driving circuit 10 drives the light emitting circuit 20 to emit light. Therefore, in the embodiments of the present disclosure, the pixels are not damaged on the basis of solving the problem of the persistently-illuminating defect.

Figure 2:
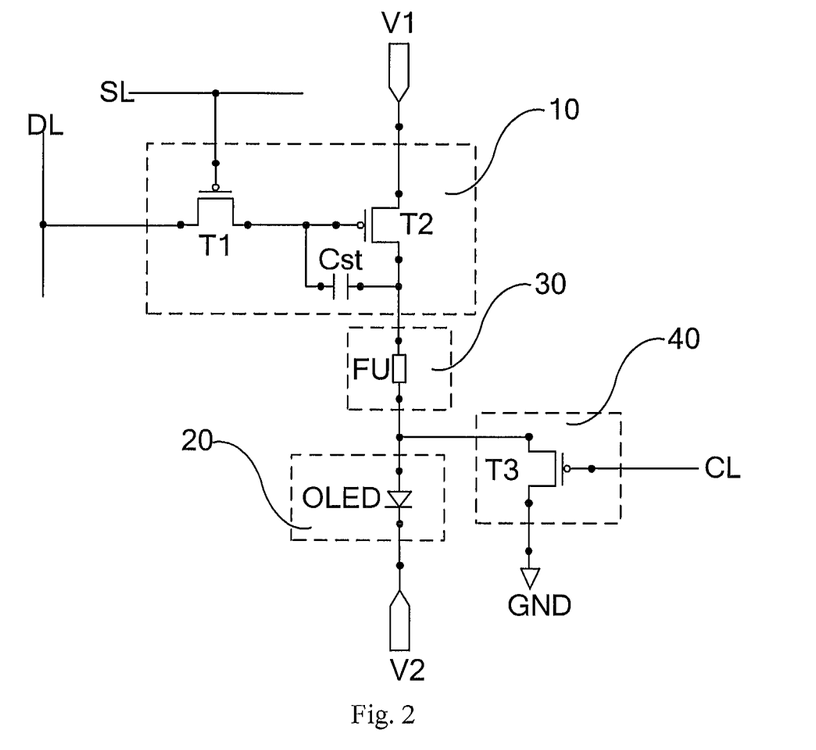
FIG. 2 is a first specific structural schematic diagram of respective sub-circuits in the pixel circuit shown in FIG. 1.
Figure 3:
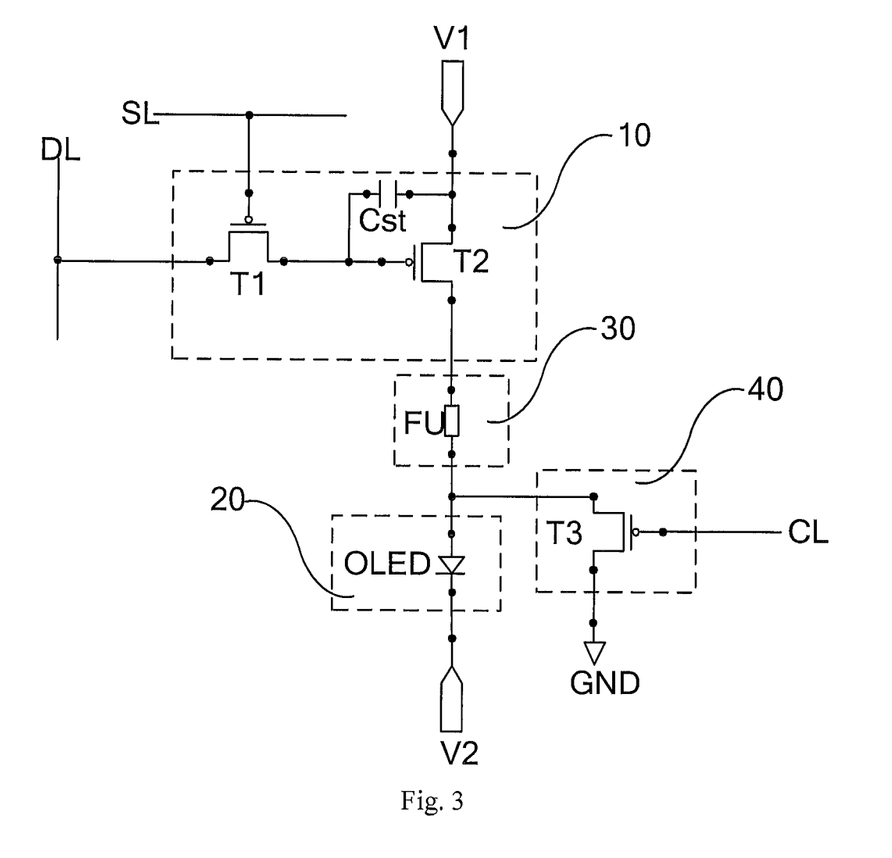
FIG. 3 is a second specific structural schematic diagram of respective sub-circuits in the pixel circuit shown in FIG. 1.

As shown in FIG. 2 and FIG. 3, the driving circuit 10 may comprise a first transistor T1, a second transistor T2 and a storage capacitor Cst.

For example, a gate electrode of the first transistor T1 is connected to the scan signal line SL, a first electrode of the first transistor T1 is connected to the data signal line DL, and a second electrode of the first transistor T1 is connected to a gate electrode of the second transistor T2.

A first electrode of the second transistor T2 is connected to the first voltage terminal V1, and a second electrode of the second transistor T2 is connected to the fusing circuit 30.

One terminal of the storage capacitor Cst is connected to the gate electrode of the second transistor T2, and another terminal of the storage capacitor Cst is connected to the second electrode of the second transistor T2 (as shown in FIG. 2), or, another terminal of the storage capacitor Cst is connected to the first electrode of the second transistor T2 (as shown in FIG. 3).

Here, the second transistor T2 is a driving transistor. For example, the first transistor T1 is a switching transistor.

It is to be noted that, the driving circuit 10 may further comprise a plurality of switching transistors connected in parallel with the first transistor T1. The driving circuit 10 may further comprise a plurality of driving transistors connected in parallel with the second transistor T2. What has been described above is only exemplary description of the driving circuit 10, and other structures that have the same functions as those of the driving circuit 10 will not be described in detail here, but all should fall within the protection scope of the present disclosure.

As shown in FIG. 2 and FIG. 3, the fusing circuit 30 may comprise a fusing element FU. The fusing element FU may comprise a fuse wire or a fuse tube and the like, and the fusing element FU may be an element that implements a fusing function by change of a voltage applied to the element.

For example, one terminal of the fusing element FU is connected to the driving circuit 10, and another terminal of the fusing element FU is connected to the light emitting circuit 20 and the fusing control circuit 40. In a case that the driving circuit 10 has the above described structure, one terminal of the fusing element FU is connected to the second electrode of the second transistor T2.

It is to be noted that, what has been described above is only exemplary description of the fusing circuit 30, and other structures that have the same functions as those of the fusing circuit 30 will not be described in detail here, but all should fall within the protection scope of the present disclosure.

As shown in FIG. 2 and FIG. 3, the fusing control circuit 40 may comprise a third transistor T3. For example, the third transistor T3 also may be referred to as a fusing control transistor.

For example, a gate electrode of the third transistor T3 is connected to the control line CL, a first electrode of the third transistor T3 is connected to the fusing circuit 30, and a second electrode of the third transistor T3 is connected to the ground terminal GND. In a case that the fusing circuit 30 has the above described structure, the first electrode of the third transistor T3 is connected to another terminal of the fusing element FU.

It is to be noted that, the fusing control circuit 40 may further comprise a plurality of switching transistors connected in parallel with the third transistor T3. What has been described above is only exemplary description of the fusing control circuit 40, and other structures that have the same functions as those of the fusing control circuit 40 will not be described in detail here, but all should fall within the protection scope of the present disclosure.

The light emitting circuit 20 comprises a light emitting element. In FIG. 2 and FIG. 3, the light emitting circuit 20 is an OLED (organic light emitting diode), which is taken as an example for illustration purpose.

For example, an anode of the light emitting element is connected to the fusing circuit 30, and a cathode of the light emitting element is connected to the second voltage terminal V2. When the fusing circuit 30 has the above structure, the anode of the light emitting element is connected to another terminal of the fusing element FU.

It is to be noted that, the light emitting element is not limited to the OLED, but may also be various current-driving light-emitting devices including a LED (light emitting diode).

Figure 4:
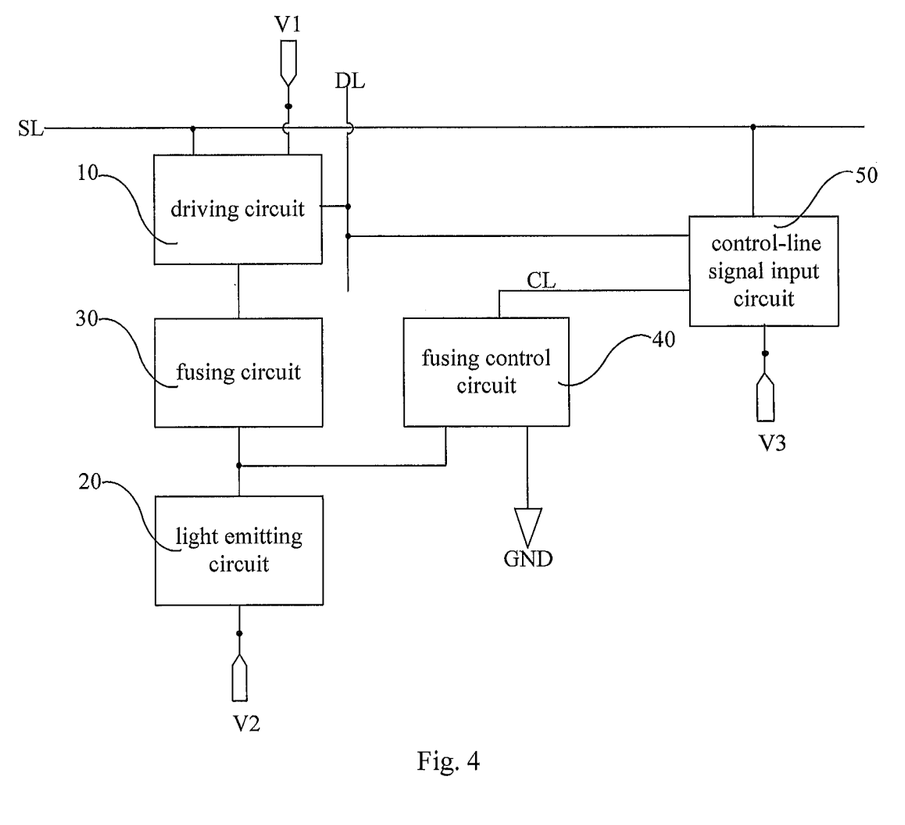
FIG. 4 is a second structural schematic diagram of a pixel circuit provided by an embodiment of the present disclosure.

In some embodiments, as shown in FIG. 4, the pixel circuit may also comprise, in addition to the respective sub-circuits as shown in FIG. 3-4, a control-line signal input circuit 50. The control-line signal input circuit 50 is respectively connected to the scan signal line SL, the data signal line DL, the control line CL and a third voltage terminal V3. The control-line signal input circuit 50 is configured to input the first signal to the control line CL when the scan signal is input to the scan signal line SL and the turn-off signal is input to the data signal line DL, so that when the driving circuit 10 outputs the driving current signal, the light emitting circuit 20 and the driving circuit 10 are disconnected.

That is: when the scan signal is input to the scan signal line SL and the turn-off signal is input to the data signal line DL, in a case that the pixel has the problem of the persistently-illuminating defect, the driving circuit 10 outputs the driving current signal. In this case, under the control of inputting the scan signal to the scan signal line SL, inputting the turn-off signal to the data signal line DL, and the third voltage terminal V3, the control-line signal input circuit 50 inputs the first signal to the control line CL, so as to control the driving current signal output by the driving circuit 10 to flow to the ground terminal GND. Thus, the connection between the light emitting circuit 20 and the driving circuit 10 is interrupted, and the light emitting circuit 20 does not emit light. When the scan signal is input to the scan signal line SL and the turn-off signal is input to the data signal line DL, in a case that the pixel does not have the problem of the persistently-illuminating defect, although the control-line signal input circuit 50 inputs the first signal to the control line CL, the fusing circuit 30 is not affected because the driving circuit 10 does not output the driving current signal, and the light emitting circuit 20 and the driving circuit 10 are still connected through the fusing circuit 30.

Under the control of inputting the scan signal to the scan signal line SL, inputting the data signal to the data signal line DL, and the third voltage terminal V3, the second signal is input to the control line CL through the control-line signal input circuit 50, so as to ensure that a current signal output by the driving circuit 10 drives the light emitting circuit 20 to emit light.

In an embodiment of the present disclosure, the pixel circuit is provided with the control-line signal input circuit 50, and the control-line signal input circuit 50 is connected to the control line CL, the scan signal line SL, the data signal line DL and the third voltage terminal V3, and so, it can be achieved to input the first signal to the control line CL when the scan signal is input to the scan signal line SL and the turn-off signal is input to the data signal line DL. In this case, if the pixel has the problem of the persistently-illuminating defect, the driving current signal output by the driving circuit 10 flows to the ground terminal GND, so as to achieve a purpose that the light emitting circuit 20 and the driving circuit 10 are automatically disconnected. If the pixel does not have the problem of the persistently-illuminating defect, the fusing circuit 30 is not affected because the driving circuit 10 does not output a driving current signal. When the scan signal is input to the scan signal line SL and the data signal is input to the data signal line DL, the normal operation of the pixel circuit may be ensured by inputting the second signal to the control line CL. For example, in a case that a turn-off signal is input to the scan signal line SL, no matter whether the first signal or the second signal is input to the control line CL, the fusing circuit 30 is not affected because the driving circuit 10 does not output a current.

Figure 5:
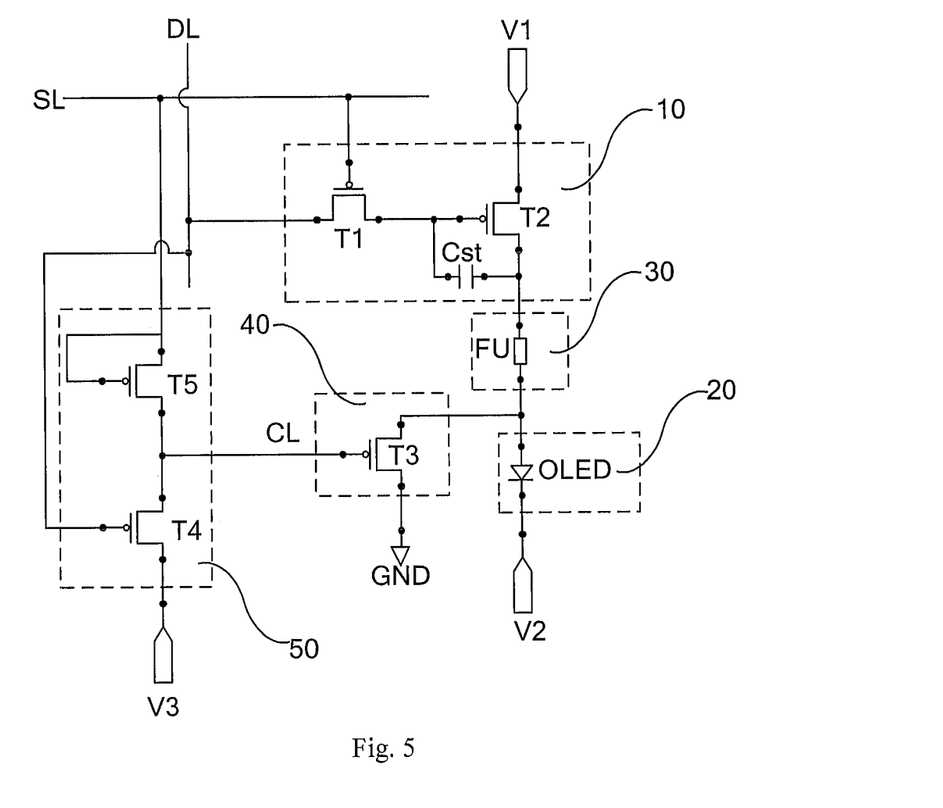
FIG. 5 is a specific structural schematic diagram of respective sub-circuits in the pixel circuit shown in FIG. 4.

Furthermore, as shown in FIG. 5, the control-line signal input circuit 50 comprises a fourth transistor T4 and a fifth transistor T5. For example, the fourth transistor T4 and the fifth transistor T5 may be respectively referred to as a first control transistor and a second control transistor.

A gate electrode of the fourth transistor T4 is connected to the data signal line DL, a first electrode of the fourth transistor T4 is connected to the control line CL, and a second electrode of the fourth transistor T4 is connected to the third voltage terminal V3.

A gate electrode and a first electrode of the fifth transistor T5 are connected to the scan signal line SL, and the second electrode of the fifth transistor T5 is connected to the first electrode of the fourth transistor T4.

For example, a width-to-length ratio of a channel of the fourth transistor T4 is 10 times or more of a width-to-length ratio of a channel of the fifth transistor T5.

For example, when the scan signal is input to the scan signal line SL and the data signal is input to the data signal line DL, the fourth transistor T4 and the fifth transistor T5 are turned on. In this case, because the width-to-length ratio of the channel of the fourth transistor T4 is 10 times or more of the width-to-length ratio of the channel of the fifth transistor T5, and therefore, the resistance of the fifth transistor T5 is greater than the resistance of the fourth transistor T4; under the control of the third voltage terminal V3, the control-line signal input circuit 50 may input the second signal to the control line CL, so as to not affect the fusing circuit 30, and the driving current signal output by the driving circuit 10 flows to the light emitting circuit 20 through the fusing circuit 30.

In a case that the scan signal is input to the scan signal line SL and the turn-off signal is input to the data signal line DL, the fourth transistor T4 is turned off, the fifth transistor T5 is turned on, and the control-line signal input circuit 50 inputs the first signal to the control line CL. For example, in this case, if the pixel circuit operates normally, the driving circuit 10 does not output the driving current signal because the turn-off signal is input to the data signal line DL, so that the fusing circuit 30 is not affected; if the pixel circuit has the problem of the persistently-illuminating defect, the driving circuit 10 outputs the driving current signal, the driving current signal output by the driving circuit 10 flows to the ground terminal GND, causing the light emitting circuit 20 and the driving circuit 10 to be disconnected, so that the driving current signal output by the driving circuit 10 can not flow to the light emitting circuit 20, and the light emitting circuit 20 no longer emits light.

When the turn-off signal is input to the scan signal line SL and the data signal is input to the data signal line DL, the fourth transistor T4 is turned on, and the fifth transistor T5 is turned off; under the control of the third voltage terminal V3, the control-line signal input circuit 50 inputs the second signal to the control line CL, without affecting the fusing circuit 30.

It is to be noted that, firstly, in a case that the fourth transistor T4 and the fifth transistor T5 both are P-type transistors, the third voltage terminal V3 is a high voltage terminal, the first signal is a low voltage signal, and the second signal is a high voltage signal. Based on this, when the fusing control circuit 40 comprises the third transistor T3, the third transistor T3 is also a P-type transistor.

In a case that the fourth transistor T4 and the fifth transistor T5 both are N-type transistors, the third voltage terminal V3 is a low voltage terminal, the first signal is a high voltage signal, and the second signal is a low voltage signal. Based on this, when the fusing control circuit 40 comprises the third transistor T3, the third transistor T3 is also an N-type transistor.

For example, when the driving circuit 10 comprises the first transistor T1 and the second transistor T2, the types of the first transistor T1 and the second transistor T2 are the same as the types of the fourth transistor T4 and the fifth transistor T5.

Secondly, the control-line signal input circuit 50 may further comprise a plurality of fourth transistors T4 connected in parallel and/or a plurality of fifth transistors T5 connected in parallel. What has been described above is only exemplary description of the control-line signal input circuit 50, and other structures that have the same functions as those of the control-line signal input circuit 50 will not be described in detail here, but all should fall within the protection scope of the present disclosure.

Based on the above description of the specific structures of respective circuits, when all the transistors in FIG. 5 are the P-type transistors, and the third voltage terminal V3 is the high voltage terminal, a working process of the pixel circuit shown in FIG. 5 is described in detail below. For example, in an equivalent circuit diagram provided by an embodiment of the present disclosure, the transistors in a turn-off state are indicated by "x", and the fusing elements FU in a melted-and-interrupted state are indicated by "x".

Figure 6A:
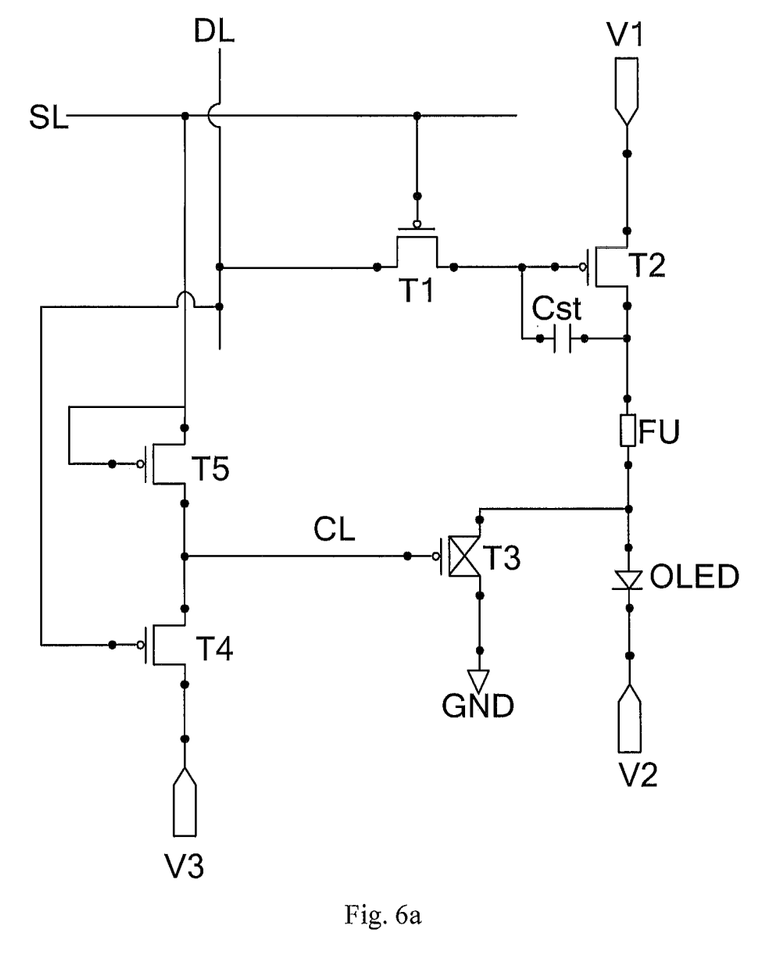
FIGS. 6a to 6d are equivalent circuit diagrams of the pixel circuit shown in FIG. 5 corresponding to different situations.
Figure 7:
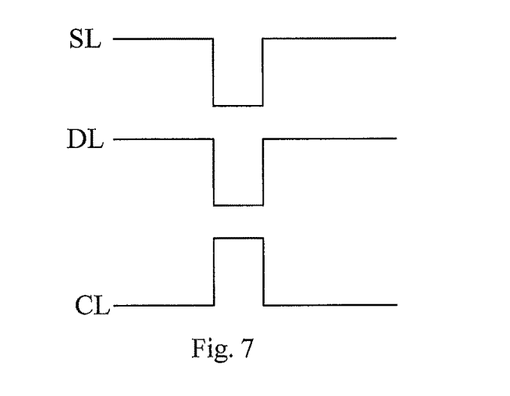
FIG. 7 is a time sequence diagram in a case that a pixel circuit normally operates.

In conjunction with the time sequence shown in FIG. 7, when the scan signal is input to the scan signal line SL and the data signal is input to the data signal line DL, as shown in FIG. 6a, the first transistor T1 and the second transistor T2 are turned on, and the second transistor T2 outputs the driving current signal; at the same time, the fourth transistor T4 and the fifth transistor T5 are turned on, a high voltage signal (i.e., the second signal) is input to the control line CL, the third transistor T3 is turned off, the driving current signal output by the second transistor T2 flows to the light emitting element through the fusing element FU, and then the light emitting element emits light.

Figure 6B:
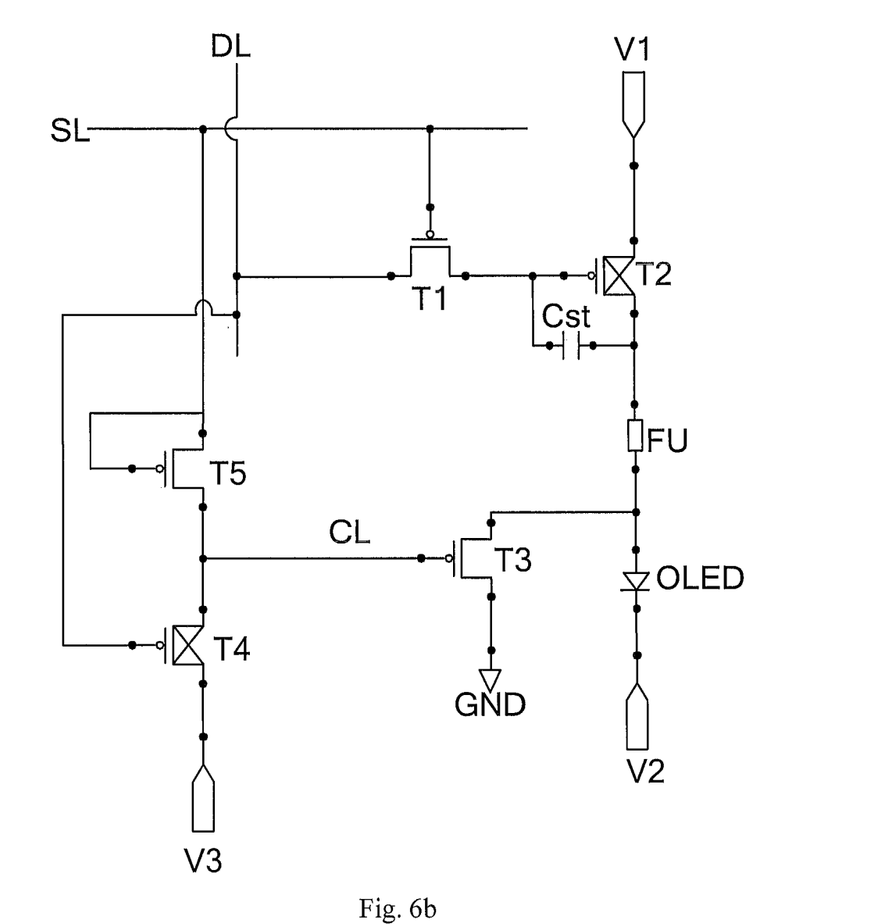

When the scan signal is input to the scan signal line SL and the turn-off signal is input to the data signal line DL, if the second transistor T2 operates normally, as shown in FIG. 6b, the first transistor T1 is turned on, the second transistor T2 is turned off, and the second transistor T2 does not output the driving current signal; at the same time, the fifth transistor T5 is turned on, the fourth transistor T4 is turned off, the low voltage signal (i.e., the first signal) is input to the control line CL, and the third transistor T3 is turned on; because the second transistor T2 does not output the driving current signal, the voltage of two terminals of the fusing element FU is not changed, and the fusing element FU is not melted to interrupt.

Figure 6C:
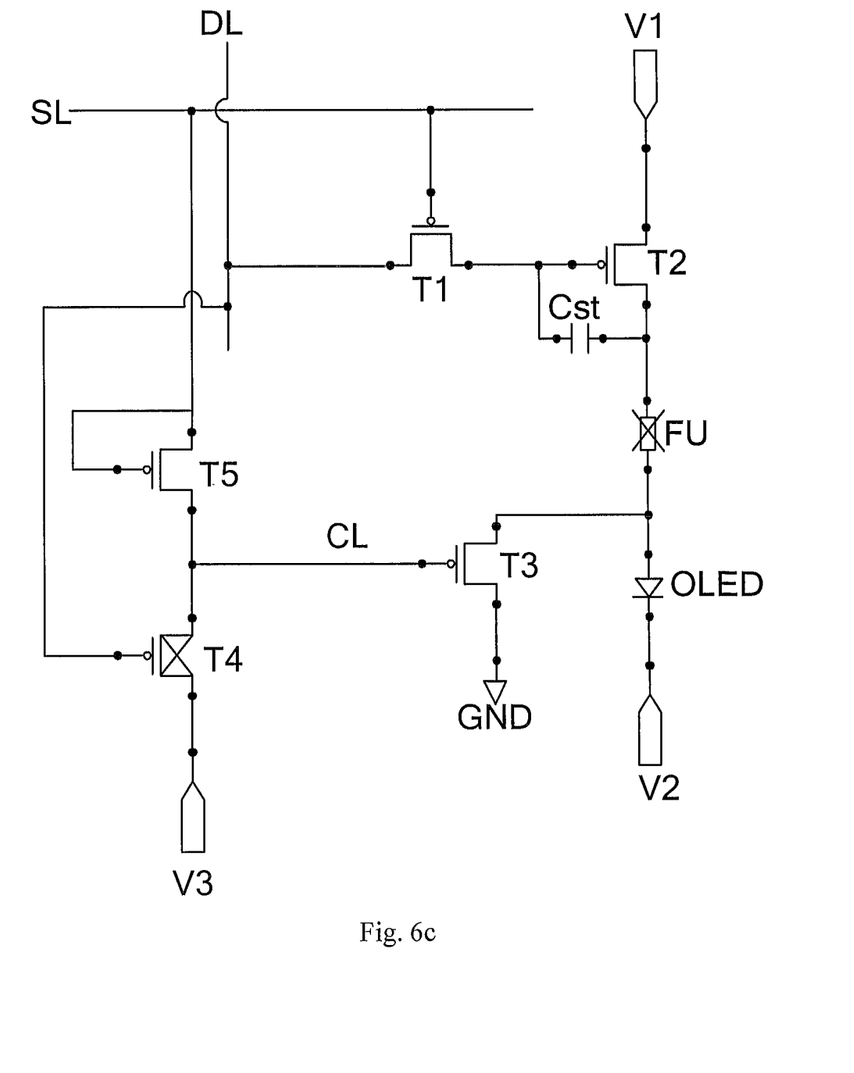

When the scan signal is input to the scan signal line SL and the turn-off signal is input to the data signal line DL, if the second transistor T2 is approximately always turned on due to design and process stability and other reasons, as shown in FIG. 6c, the first transistor T1 is turned on, and the second transistor T2 outputs the driving current signal; at the same time, the fifth transistor T5 is turned on, the fourth transistor T4 is turned off, the low voltage signal (i.e., the first signal) is input to the control line CL, and the third transistor T3 is turned on, so that the driving current signal output by the second transistor T2 flows to the ground terminal GND. In this case, because the voltage of two terminals of the fusing element FU is changed, the fusing element FU is melted and interrupted, so that the light emitting element is turned off.

Figure 6D:
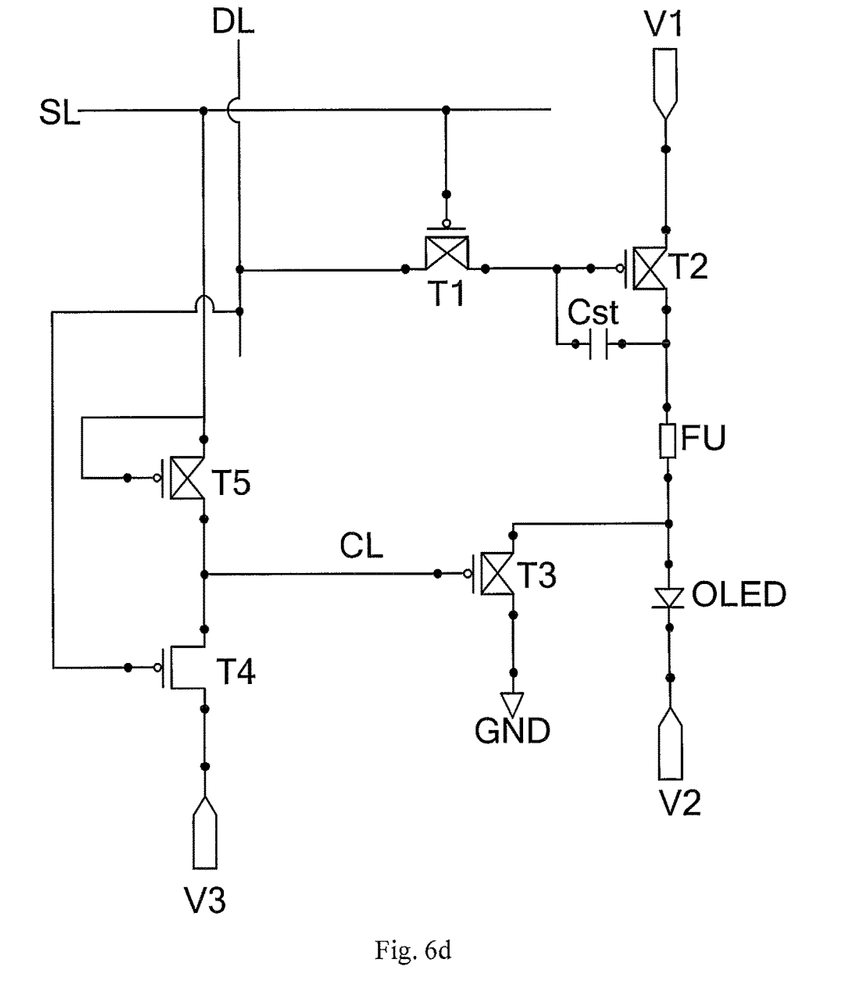

When the scan signal is input to the scan signal line SL and the data signal is input to the data signal line DL, as shown in FIG. 6d, the first transistor T1, the second transistor T2, the third transistor T3 and the fifth transistor T5 are turned off, and have on effect on the fusing element FU.

It is to be noted that, except for the second transistor T2 (i.e., the driving transistor), the embodiments of the present disclosure do not limit the first electrode and the second electrode of the other transistors. For each of the other transistors: the first electrode may be a drain electrode, and the second electrode may be a source electrode; alternatively, the first electrode may be the source electrode, and the second electrode may be the drain electrode. In a case that the driving transistor is the P-type transistor, because a source voltage of the P-type transistor is higher than a drain voltage of the P-type transistor, and therefore, the first electrode of the driving transistor is the source electrode, and the second electrode of the driving transistor is the drain electrode. In a case that the driving transistor is the N-type transistor, which is exactly opposite to the P-type transistor (that is, the first electrode of the driving transistor is the drain electrode, and the second electrode of the driving transistor is the source electrode).

An embodiment of the present disclosure further provides a display device, comprising any one of the pixel circuit described above.

Taking into account a silicon-based OLED display device, the OLED display device has high resolution, and the problem of the persistently-illuminating defect may easily occur. Therefore, the display device may be the OLED display device.

The display device provided by the embodiments of the present disclosure has the same advantages as those of the pixel circuit provided by the aforementioned embodiments of the present disclosure. Because the pixel circuit has been described in detail in the aforementioned embodiments, similar description will be omitted here.

Figure 8:
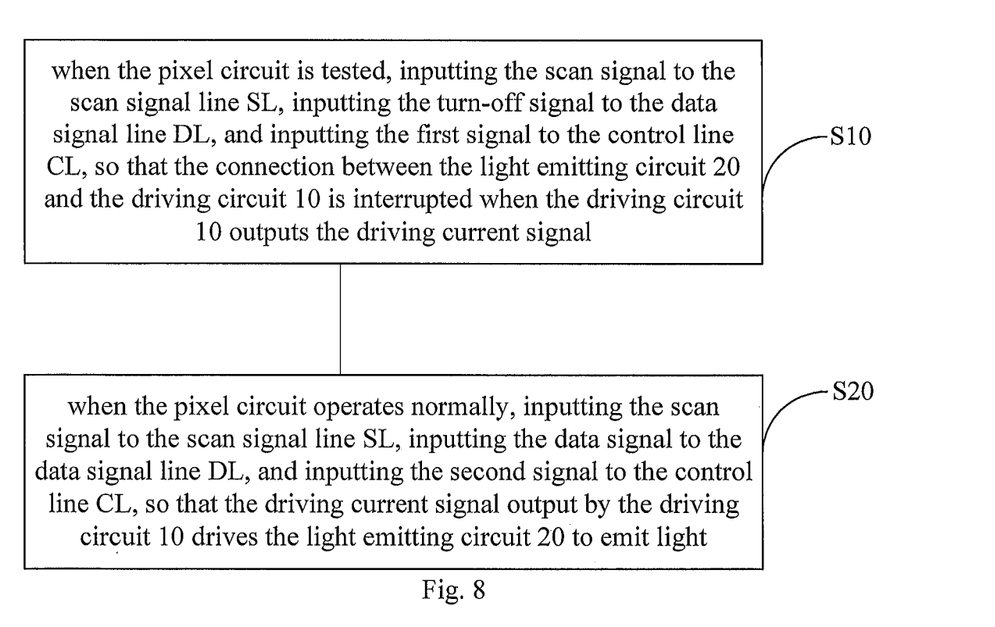
FIG. 8 is a flow chart of a driving method of a pixel circuit provided by an embodiment of the present disclosure.

An embodiment of the present disclosure further provides a driving method of a pixel circuit. The driving method is used for driving any one of the pixel circuits as described above. As shown in FIG. 8, the driving method comprises:

Step S10, when the pixel circuit is tested, inputting the scan signal to the scan signal line SL, inputting the turn-off signal to the data signal line DL, and inputting the first signal to the control line CL, so that the connection between the light emitting circuit 20 and the driving circuit 10 is interrupted when the driving circuit 10 outputs the driving current signal.

Here, if the pixel circuit has the problem of the persistently-illuminating defect, the driving current signal output from the driving circuit 10 to the fusing circuit 30 flows to the ground terminal GND, and the connection between the light emitting circuit 20 and the driving circuit 10 is interrupted. If the pixel circuit does not have the problem of the persistently-illuminating defect, even if the first signal is input to the control line CL, the light emitting circuit 20 and the driving circuit 10 are still connected through the fusing circuit 30 (that is, the fusing circuit 30 is not interrupted) because the driving circuit 10 does not output the driving current signal.

Step S20, when the pixel circuit operates normally, inputting the scan signal to the scan signal line SL, inputting the data signal to the data signal line DL, and inputting the second signal to the control line CL, so that the driving current signal output by the driving circuit 10 drives the light emitting circuit 20 to emit light.

An embodiment of the present disclosure provides a driving method of a pixel circuit. By inputting the scan signal to the scan signal line SL, inputting the turn-off signal to the data signal line DL, and inputting the first signal to the control line CL, in a case that the pixel circuit has the problem of the persistently-illuminating defect, the driving current signal output from the driving circuit 10 to the fusing circuit 30 flows to the ground terminal GND, and the connection between the light emitting circuit 20 and the driving circuit 10 is interrupted, so that the problem of the persistently-illuminating defect can be solved. In a case that the pixel circuit does not have the problem of the persistently-illuminating defect, because the driving circuit 10 does not output the driving current signal, the light emitting circuit 20 and the driving circuit 10 are still connected through the fusing circuit 30, which does not affect the normal operation of the pixel circuit. For example, when the pixel circuit operates normally, the scan signal is input to the scan signal line SL, the data signal is input to the data signal line DL, and the second signal is input to the control line CL, so as to ensure that the driving current signal output by the driving circuit 10 drives the light emitting circuit 20 to emit light. Therefore, in the embodiments of the present disclosure, the pixels are not damaged on the basis of solving the problem of the persistently-illuminating defect.

For example, inputting the first signal or the second signal to the control line CL comprises: under the control of the scan signal line SL, the data signal line DL and the third voltage terminal V3, inputting the first signal or the second signal to the control line CL through the control-line signal input circuit 50.

In this way, when the scan signal is input to the scan signal line SL and the turn-off signal is input to the data signal line DL, the first signal can be automatically output under the control of the third voltage terminal V3; and when the scan signal is input to the scan signal line SL and the data signal is input to the data signal line DL, the second signal can be automatically output, so that the pixel circuit is simplified.

In the present disclosure, the relational terms such as "first," "second," etc., are merely used to distinguish one entity or operation from another entity or operation, but do not necessarily require or imply that these entities or operations have any actual relationship or sequence. Moreover, the terms "comprise," "comprising," or any other variations thereof are intended to cover a non-exclusive inclusion, so that process(es), method(s), article(s), or equipment(s), which include a series of elements, not only include those elements but also other elements that are not explicitly listed, or also include elements inherent to the process(es), the method(s), the article(s) or the equipment(s). Without further limitation(s), an element limited by the statement "including a . . . " does not exclude that the process(es), the method(s), the article(s) or the equipment(s), which include the elements, also include other identical elements.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

The application claims priority to the Chinese patent application No. 201611196080.8, filed Dec. 21, 2016, the entire disclosure of which is incorporated herein by reference as part of the present application.

What is claimed is:

1. A pixel circuit, comprising: a driving circuit, a light emitting circuit, a fusing circuit and a fusing control circuit, wherein:
    the driving circuit is respectively connected to a scan signal line, a data signal line, a first voltage terminal and the fusing circuit, and is configured to convert a voltage signal input from the first voltage terminal into a driving current signal under control of the scan signal line and the data signal line, and to output the driving current signal to the fusing circuit;
    the fusing circuit is further connected to the fusing control circuit and the light emitting circuit, and is configured to disconnect the light emitting circuit from the driving circuit under control of the fusing control circuit;
    the fusing control circuit is further connected to a control line and a ground terminal, and is configured to control the driving current signal output from the driving circuit to flow to the ground terminal under control of a signal input from the control line, so as to disconnect the light emitting circuit from the driving circuit; and
    the light emitting circuit is further connected to a second voltage terminal, and is configured to emit light driven by the driving current signal under control of the second voltage terminal in a case that a connection between the light emitting circuit and the driving circuit is not interrupted;
    the pixel circuit further comprises a control-line signal input circuit;
    the control-line signal input circuit is respectively connected to the scan signal line, the data signal line, the control line and a third voltage terminal, and is configured to input a first signal to the control line in a case that a scan signal is input to the scan signal line, and a turn-off signal is input to the data signal line, so as to disconnect the light emitting circuit from the driving circuit when the driving circuit outputs the driving current signal.

2. The pixel circuit according to claim 1, wherein the driving circuit comprises a first transistor, a second transistor and a storage capacitor;
    a gate electrode of the first transistor is connected to the scan signal line, a first electrode of the first transistor is connected to the data signal line, and a second electrode of the first transistor is connected to a gate electrode of the second transistor;
    a first electrode of the second transistor is connected to the first voltage terminal, and a second electrode of the second transistor is connected to the fusing circuit; and
    one terminal of the storage capacitor is connected to the gate electrode of the second transistor, and another terminal of the storage capacitor is connected to the second electrode of the second transistor, or another terminal of the storage capacitor is connected to the first electrode of the second transistor.

3. The pixel circuit according to claim 1, wherein the fusing circuit comprises a fusing element;
    one terminal of the fusing element is connected to the driving circuit, and another terminal of the fusing element is connected to the light emitting circuit and the fusing control circuit.

4. The pixel circuit according to claim 1, wherein the fusing control circuit comprises a third transistor;
    a gate electrode of the third transistor is connected to the control line, a first electrode of the third transistor is connected to the fusing circuit, and a second electrode of the third transistor is connected to the ground terminal.

5. The pixel circuit according to claim 1, wherein the light emitting circuit comprises a light emitting element;
    an anode of the light emitting element is connected to the fusing circuit, and a cathode of the light emitting element is connected to the second voltage terminal.

6. The pixel circuit according to claim 1, wherein the control-line signal input circuit comprises a fourth transistor and a fifth transistor;
    a gate electrode of the fourth transistor is connected to the data signal line, a first electrode of the fourth transistor is connected to the control line, and a second electrode of the fourth transistor is connected to the third voltage terminal;
    a gate electrode and a first electrode of the fifth transistor are connected to the scan signal line, and the second electrode of the fifth transistor is connected to the first electrode of the fourth transistor; and
    a width-to-length ratio of a channel of the fourth transistor is 10 times or more of a width-to-length ratio of a channel of the fifth transistor.

7. A display device, comprising a pixel circuit according to claim 1.

8. A driving method of pixel circuits, used for driving the pixel circuit according to claim 1, comprising:
    when the pixel circuit is tested, inputting a scan signal to the scan signal line, inputting a turn-off signal to the data signal line, and inputting a first signal to the control line, so that a connection between the light emitting circuit and the driving circuit is interrupted when the driving circuit outputs a driving current signal; and
    when the pixel circuit operates normally, inputting the scan signal to the scan signal line, inputting the data signal to the data signal line, and inputting a second signal to the control line, so that the driving current signal output by the driving circuit drives the light emitting circuit to emit light.

9. The driving method according to claim 8, wherein inputting the first signal or the second signal to the control line comprises:

under control of the scan signal line, the data signal line and the third voltage terminal, inputting the first signal or the second signal to the control line through the control-line signal input circuit.

* * * * *